US012681390B2

(12) United States Patent
Kestel et al.

(10) Patent No.: US 12,681,390 B2
(45) Date of Patent: Jul. 14, 2026

(54) COMPONENT OF AN OPTICAL SYSTEM

(71) Applicant: Carl Zeiss SMT GmbH, Oberkochen (DE)

(72) Inventors: Matthias Kestel, Dresden (DE); Matthias Mueller, Lauchheim (DE); Roland Gischa, Bibertal (DE); Philipp Weishaupt, Ingolstadt (DE); Thomas Stuebler, Haunsfeld (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 628 days.

(21) Appl. No.: 17/953,464

(22) Filed: Sep. 27, 2022

(65) Prior Publication Data

US 2023/0023575 A1     Jan. 26, 2023

Related U.S. Application Data

(63) Continuation of application No. PCT/EP2020/081509, filed on Nov. 9, 2020.

(30) Foreign Application Priority Data

Apr. 14, 2020     (DE) .......................... 102020204669.7

(51) Int. Cl.
*G03F 7/00*          (2006.01)
*G03F 7/20*          (2006.01)

(52) U.S. Cl.
CPC ........ *G03F 7/70075* (2013.01); *G03F 7/2041* (2013.01)

(58) Field of Classification Search
CPC ............... G03F 7/70075; G03F 7/2041; G03F 7/70825; G03F 7/70891; G02B 5/0891; G02B 7/1815; H05K 7/2029
See application file for complete search history.

(56) References Cited

U.S. PATENT DOCUMENTS 7,183,674 B2     2/2007 Koorneef
7,329,014 B2 *   2/2008 Balogh .................. G21K 1/062
                                                  359/845

(Continued)

FOREIGN PATENT DOCUMENTS

DE          100 06 199 A1      8/2001
DE      102008009600 A1      8/2009

(Continued)

OTHER PUBLICATIONS

Translation of International Preliminary Report on Patentability for corresponding PCT Appl No. PCT/EP2020/081509, mailed Oct. 27, 2022.

(Continued)

*Primary Examiner* — Wyatt A Stoffa
*Assistant Examiner* — Samanvitha Sridhar
(74) *Attorney, Agent, or Firm* — Fish & Richardson P.C.

(57)          ABSTRACT

A component of an optical system comprises an optical element and a first channel system outside the optical element and through which a cooling fluid can flow, such that, during operation of the optical system, heat generated by electromagnetic radiation incident on the optical element is absorbed and drawn off via the cooling fluid in the first channel system. The component also includes a second channel system through which a cooling fluid can flow to at least partially thermally shield a region of the component from the heat absorbed by the cooling fluid in the first channel system. The second channel system is outside the first channel system in the radial direction relative to the center of the optical element.

20 Claims, 19 Drawing Sheets

(56)          References Cited

U.S. PATENT DOCUMENTS

| | | | | |
|---|---|---|---|---|
| 7,740,362 | B1 | 6/2010 | Neil | |
| 9,007,559 | B2 * | 4/2015 | Layh | G03F 7/70891 |
| | | | | 355/30 |
| 10,613,444 | B2 * | 4/2020 | Liao | G03F 7/70825 |
| 2001/0033912 | A1 | 10/2001 | Sommer | |
| 2011/0001947 | A1 | 1/2011 | Dinger et al. | |
| 2011/0025992 | A1 | 2/2011 | Holderer et al. | |
| 2011/0051267 | A1 * | 3/2011 | Kierey | G02B 7/181 |
| | | | | 359/845 |
| 2011/0255068 | A1 * | 10/2011 | Kools | G03F 7/7015 |
| | | | | 355/71 |
| 2014/0071523 | A1 | 3/2014 | Hartjes et al. | |
| 2014/0247512 | A1 | 9/2014 | Scheiding | |
| 2017/0108788 | A1 | 4/2017 | Heintel | |

FOREIGN PATENT DOCUMENTS

| | | | |
|---|---|---|---|
| DE | 10 2011 016 769 A1 | 12/2011 | |
| DE | 102011005778 A1 | 9/2012 | |
| DE | 10 2014 219 770 A1 | 3/2016 | |
| DE | 10 2018 208 783 A1 | 7/2018 | |
| DE | 10 2018 216 645 A1 | 11/2018 | |
| DE | 10 2020 204 665 A1 | 3/2021 | |
| DE | 10 2020 214 130 A1 | 8/2021 | |
| KR | 2011-0013330 A | 2/2011 | |
| WO | WO 2005/026843 A2 | 3/2005 | |

OTHER PUBLICATIONS

GPTO-Office-Action, with translation thereof, for corresponding DE 10 2020 204 669.7 dated Sep. 24, 2020.
Translation of International Search Report for corresponding PCT Appl No. PCT/EP2020/081509, mailed Mar. 15, 2021.
Office Action in Korean Appln. No. 10-2022-7035187, mailed on Aug. 19, 2025, 15 pages (with English translation).
Office Action in Korean Appln. No. 10-2022-7035187, mailed on Feb. 26, 2026, 10 pages (with English translation).

* cited by examiner

<u>Fig. 1C</u>
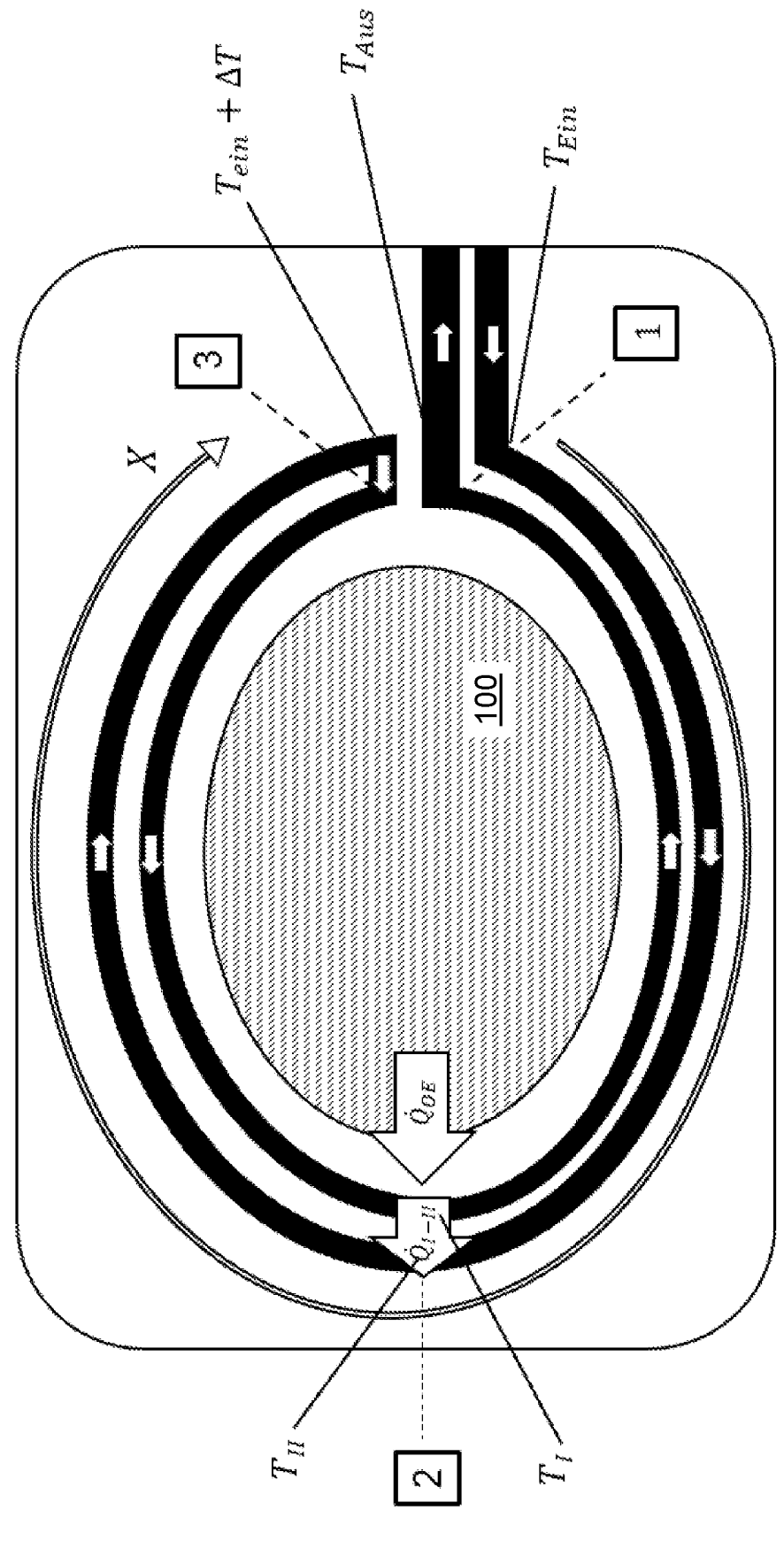

220a

220a

COMPONENT OF AN OPTICAL SYSTEM

CROSS-REFERENCE TO RELATED APPLICATIONS

The present application is a continuation of, and claims benefit under 35 USC 120 to, international application PCT/EP2020/081509, filed Nov. 9, 2020, which claims benefit under 35 USC 119 of German Application No. 10 2020 204 669.7, filed Apr. 14, 2020. The entire disclosure of these applications are incorporated by reference herein.

FIELD

The disclosure relates to an assembly of an optical system.

BACKGROUND

Microlithography is used for producing microstructured components, such as for example integrated circuits or LCDs. The microlithography process can be carried out in what is known as a projection exposure apparatus, which includes an illumination device and a projection lens. The image of a mask (=reticle) illuminated via the illumination device is in this case projected via the projection lens onto a substrate (for example a silicon wafer) that is coated with a light-sensitive layer (photoresist) and arranged in the image plane of the projection lens in order to transfer the mask structure to the light-sensitive coating of the substrate.

In projection lenses designed for the EUV range, i.e. at wavelengths of for example approximately 13.5 nm or less, mirrors are used as optical components for the imaging process owing to the general lack of availability of suitable light-transmissive refractive materials.

In the illumination device of a microlithographic projection exposure apparatus designed for operation in the EUV, for example, the use of facet mirrors in the form of field facet mirrors and pupil facet mirrors as focusing components is known for example from DE 10 2008 009 600 A1. Facet mirrors of this type are typically constructed from a large number of mirror elements or mirror facets, which can each be designed to be tiltable via flexures for the purpose of adjustment or also for implementing specific illumination angle distributions. These mirror facets can in turn comprise a plurality of micromirrors. Moreover, the use of mirror arrays which comprise a multiplicity of mutually independently adjustable mirror elements in an illumination device of a microlithographic projection exposure apparatus, designed for operation at wavelengths in the VUV range, for setting defined illumination settings (i.e. intensity distributions in a pupil plane of the illumination device) is also known, for example, from WO 2005/026843 A2.

As a result inter alia of absorption of the radiation emitted by the EUV light source, the EUV mirrors or mirror elements can heat up and undergo an associated thermal expansion or deformation, which in turn can result in an impairment of the imaging properties of the optical system. Various approaches are known for avoiding surface deformations caused by heat inputs into an EUV mirror and optical aberrations associated therewith.

It is known inter alia to use a material with ultra-low thermal expansion ("Ultra Low Expansion Material"), for example a titanium silicate glass sold by Corning Inc. with the name ULE™, as the mirror substrate material and to set what is known as the zero-crossing temperature in an area near the optically effective surface. At this zero-crossing temperature, which lies at around $\vartheta=30°$ C. for example for ULE™, the coefficient of thermal expansion has in its temperature dependence a zero crossing in the vicinity of which no thermal expansion or only negligible thermal expansion of the mirror substrate material takes place. Other approaches to avoiding surface deformations caused by heat inputs into an EUV mirror include active direct cooling or direct electrical heating.

With active cooling of the aforementioned mirrors or mirror elements, with increasing power of the light source, the achievement of sufficiently efficient heat dissipation while still ensuring high precision of the mirrors or mirror elements can represent a demanding challenge.

For example, when using a cooling channel through which a cooling fluid (e.g. cooling water) can flow for the purpose of heat dissipation, the unavoidable heating of the cooling fluid can ultimately lead to areas of the optical system having the respective mirror (for example a holder for the mirror in question or also a supporting structure of the optical system) assuming the temperature of the heated cooling fluid. This in turn can mean that the relevant areas of the optical system are no longer at the reference temperature for which they were designed and which typically corresponds to the coolant inlet temperature. This in turn can result in undesirable thermally induced deformations in the corresponding areas.

FIGS. 12A-12D show schematic representations of this. According to FIG. 12A-12B, an optical element 1200 in the form of a mirror is shown in a plan view or in section, with "1205" denoting a holder or outer enclosure of this optical element 1200. The assembly according to FIG. 12A-12B has a channel system 1210 through which a cooling fluid (as indicated by the arrows drawn in FIG. 12A) flows to absorb heat that is generated by electromagnetic radiation incident on the optical element 1200. The cooling fluid thereby heats up continuously while it flows around the optical element 1200 in the channel system 1210.

According to FIG. 12C-12D, a radiation-induced heating of the optical element 1200 from an initial temperature of 22° C. to a temperature of 25° C. results in the example of a heating of the cooling fluid flowing in the channel system 1210 from an original inlet temperature of $T_1=22°$ C. to a temperature of $T_2=23°$ C. (with this heating being dependent on the heat flow emanating from the optical element 1200, the cooling fluid throughput in the cooling channel 1210 and the specific heat capacity of the cooling fluid). In the example, this in turn finally leads to heating of the outer area (i.e. the area on the side of the channel system 1210 facing away from the optical element 1200) of the assembly or of the holder 1205 to a temperature of $T_2=23°$ C. and thus to undesired deformations. According to FIG. 12B, it is assumed for the sake of simplicity that there is optimal thermal insulation between the holder 1205 and an outer supporting structure (not shown), so that there is no longer any heat exchange from the (adiabatic) holder 1205 to the outside.

SUMMARY

The present disclosure seeks to provide an assembly of an optical system which makes it possible to effectively avoid thermally induced deformations even under comparatively high thermal loads.

In an aspect, the disclosure provides an assembly of an optical system having:
  an optical element;
  a first channel system, which is arranged outside the
    optical element and through which a cooling fluid can flow, with heat that is generated during operation of the optical system by electromagnetic radiation incident on the optical element being absorbed and dissipated by way of the cooling fluid in the first channel system; and a second channel system, through which a cooling fluid can flow, for at least partially thermally shielding an area of the assembly from the heat absorbed by the cooling fluid in the first channel system;

the second channel system being arranged outside the first channel system in the radial direction in relation to a center of the optical element.

The disclosure involves the concept of using, in an optical system having an optical element (for example a mirror), in addition to a first channel system through which a cooling fluid can flow for heat absorption and dissipation, at least one second channel system through which a cooling fluid can flow, which serves for shielding an area (for example on the side of the first channel system facing away from the optical element) from the heat absorbed by the cooling fluid in the first channel system. The second channel system is in this case arranged outside the first channel system in relation to a center of the optical element in the radial direction (and thus downstream of the first channel system in the direction of heat flow relative to the heat flow emanating from the optical element). According to the disclosure, this second channel system can be used to prevent the thermally shielded area in question from following the temperature of the cooling fluid flowing through the first channel system (which increases during operation of the optical system as a result of exposure of the optical element to electromagnetic radiation).

In other words, according to the disclosure the area that is thermally shielded by the second channel system can be kept at a lower temperature than the temperature of the heated cooling fluid, and for example at the temperature originally present when the cooling fluid entered the first channel system (=cooling fluid inlet temperature).

As a result, the initially described thermally induced deformations associated with heating of the cooling fluid, for example within a holder of the optical element or a supporting structure of the optical system, can be avoided or at least reduced.

According to one embodiment, the first channel system is arranged within a holder located outside the optical element.

According to one embodiment, the second channel system is also arranged within this holder.

According to one embodiment, the holder forms an outer enclosure of the optical element.

According to one embodiment, the at least partially thermally shielded area is arranged on the side of the first channel system facing away from the optical element.

According to one embodiment, the first channel system and the second channel system are arranged concentrically in relation to a center of the optical element.

According to one embodiment, the area of the assembly that is thermally shielded by the second channel system comprises a holder for the optical element or a supporting structure for the optical system.

According to one embodiment, an area of increased thermal insulation is arranged between the first channel system and the second channel system. For example, this area may comprise at least one gap. Such an area of increased thermal insulation and the additional thermal resistance that this provides between the first and second channel systems can at least largely prevent heating of the cooling fluid in the second channel system by thermally decoupling the first and second channel systems from one another, even if the temperature increases significantly within the first channel system (so that an undesired "heat exchanger effect" can be prevented).

According to one embodiment, at least one further channel system is arranged between the first channel system and the second channel system. As a result, a heat flow between the first and the second channel system can be further reduced and thus maintenance of the coolant inlet temperature on the side of the second channel system (serving for thermal shielding) can be ensured even more efficiently.

According to one embodiment, the first channel system and/or the second channel system is/are formed as a channel array made up of a plurality of channels.

According to one embodiment, the first channel system and the second channel system are in fluid communication.

According to one embodiment, this fluid communication is implemented by a plurality of nozzles. In this way, impingement cooling from the comparatively colder second channel system to the comparatively warmer first channel system can be effectively implemented.

According to one embodiment, the fluid communication is configured in such a way that cooling fluid enters the first channel system after flowing through the second channel system.

According to one embodiment, the first channel system and the second channel system are configured as separate in such a way that cooling fluid can flow through both channel systems independently of one another.

According to one embodiment, the first channel system and/or the second channel system branch(es) at least once into areas through which coolant can flow simultaneously.

According to one embodiment, the first channel system is connected to a volumetric cooler for cooling the optical element.

According to one embodiment, the optical element is a mirror or a mirror array with a plurality of mirror elements.

In an aspect, the disclosure also relates to an optical system, for example a microlithographic projection exposure apparatus, with an assembly according to the disclosure.

Further configurations of the disclosure are evident from the description and the dependent claims.

The disclosure is explained in greater detail below on the basis of exemplary embodiments shown in the accompanying figures.

BRIEF DESCRIPTION OF THE DRAWINGS

In the figures:

FIGS. 1A-1D show schematic representations for explaining a principle relating to the present disclosure is based;

EXEMPLARY EMBODIMENTS

Figure 13:
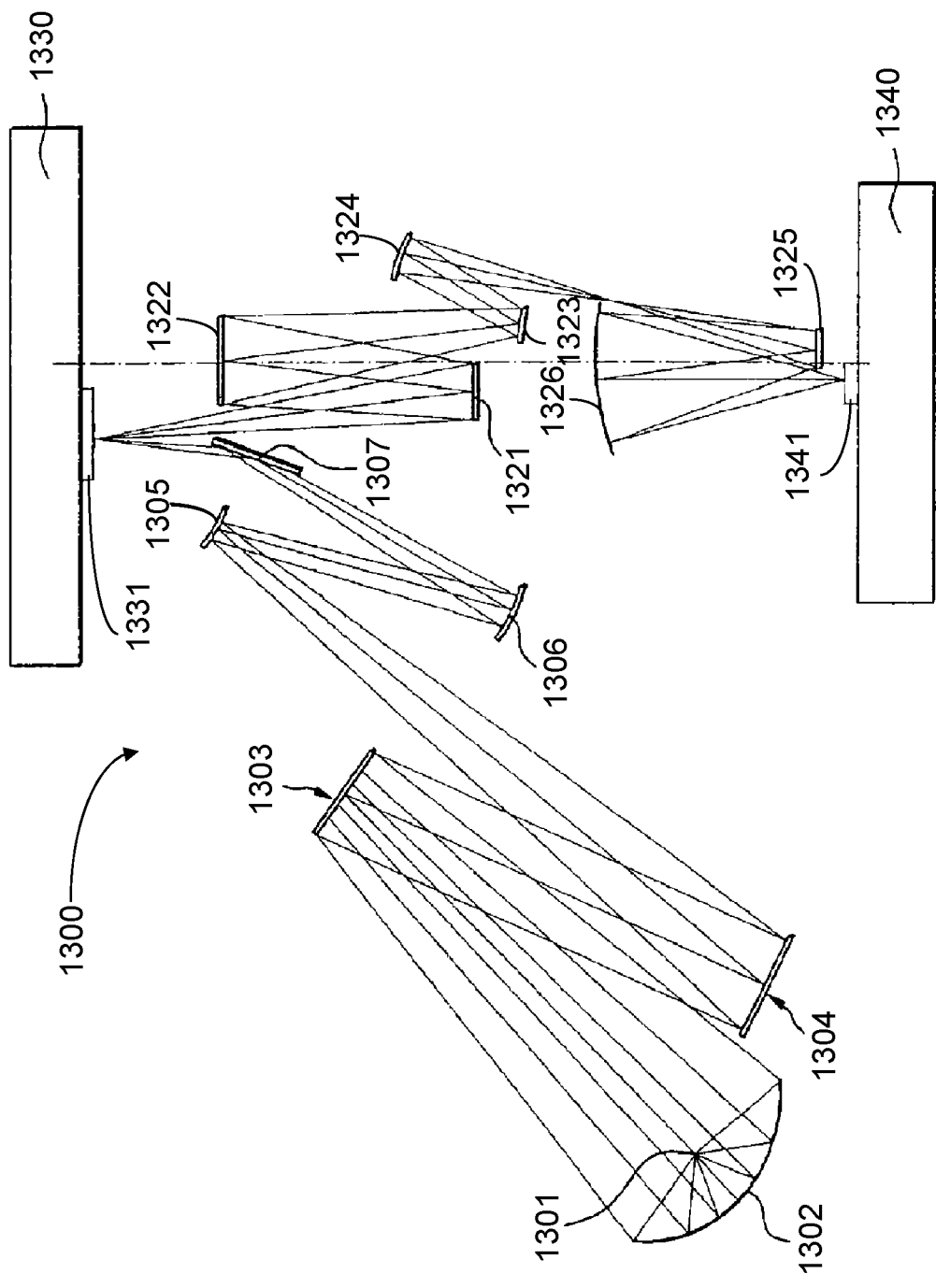
FIG. 13 shows a schematic representation of the possible construction of a microlithographic projection exposure apparatus designed for operation in the EUV.

FIG. 13 firstly shows a schematic representation of a projection exposure apparatus 1300, which is designed for operation in the EUV and in which the disclosure can be implemented for example.

According to FIG. 13, an illumination device of the projection exposure apparatus 1300 has a field facet mirror 1303 and a pupil facet mirror 1304. The light from a light source unit, which in the example comprises an EUV light source (plasma light source) 1301 and a collector mirror 1302, is directed onto the field facet mirror 1303. A first telescope mirror 1305 and a second telescope mirror 1306 are arranged downstream of the pupil facet mirror 1304 in the light path. Arranged downstream in the light path is a deflection mirror 1307, which directs the radiation incident on it onto an object field in the object plane of a projection lens comprising six mirrors 1321-1326. At the location of the object field, a reflective structure-bearing mask 1331 is arranged on a mask stage 1330 and with the aid of the projection lens is projected as an image into an image plane in which a substrate 1341 coated with a light-sensitive layer (photoresist) is situated on a wafer stage 1340.

During operation of the optical system or the microlithographic projection exposure apparatus, the electromagnetic radiation incident on the optically effective surface of the mirrors is partly absorbed and, as explained in the introduction, leads to heating and an associated thermal deformation, which can in turn result in an impairment of the imaging properties of the optical system. The disclosure can be used to cool one or more mirrors of the microlithographic projection exposure apparatus.

However, the disclosure is not restricted to use in a projection exposure apparatus designed for operation in the EUV. For example, the disclosure can also be advantageously used in a projection exposure apparatus designed for operation in the DUV (i.e. at wavelengths less than 250 nm, for example less than 200 nm) or also in another optical system.

Although the optical element in each of the embodiments described below is a mirror, the disclosure is not restricted to this. In other applications, the optical element may for example also be a lens.

The embodiments described below have in common that in an assembly with an optical element that heats up as a result of exposure to electromagnetic radiation, in addition to a first channel system which serves to dissipate heat and through which a cooling fluid can flow, a second channel system is used, which serves thermally shielding an area of the assembly at least partially from the heat absorbed by the cooling fluid in the first channel system.

The construction and functioning of an assembly according to the disclosure are first explained below with reference to the schematic representations in FIG. 1A-1D.

Figure 1A:
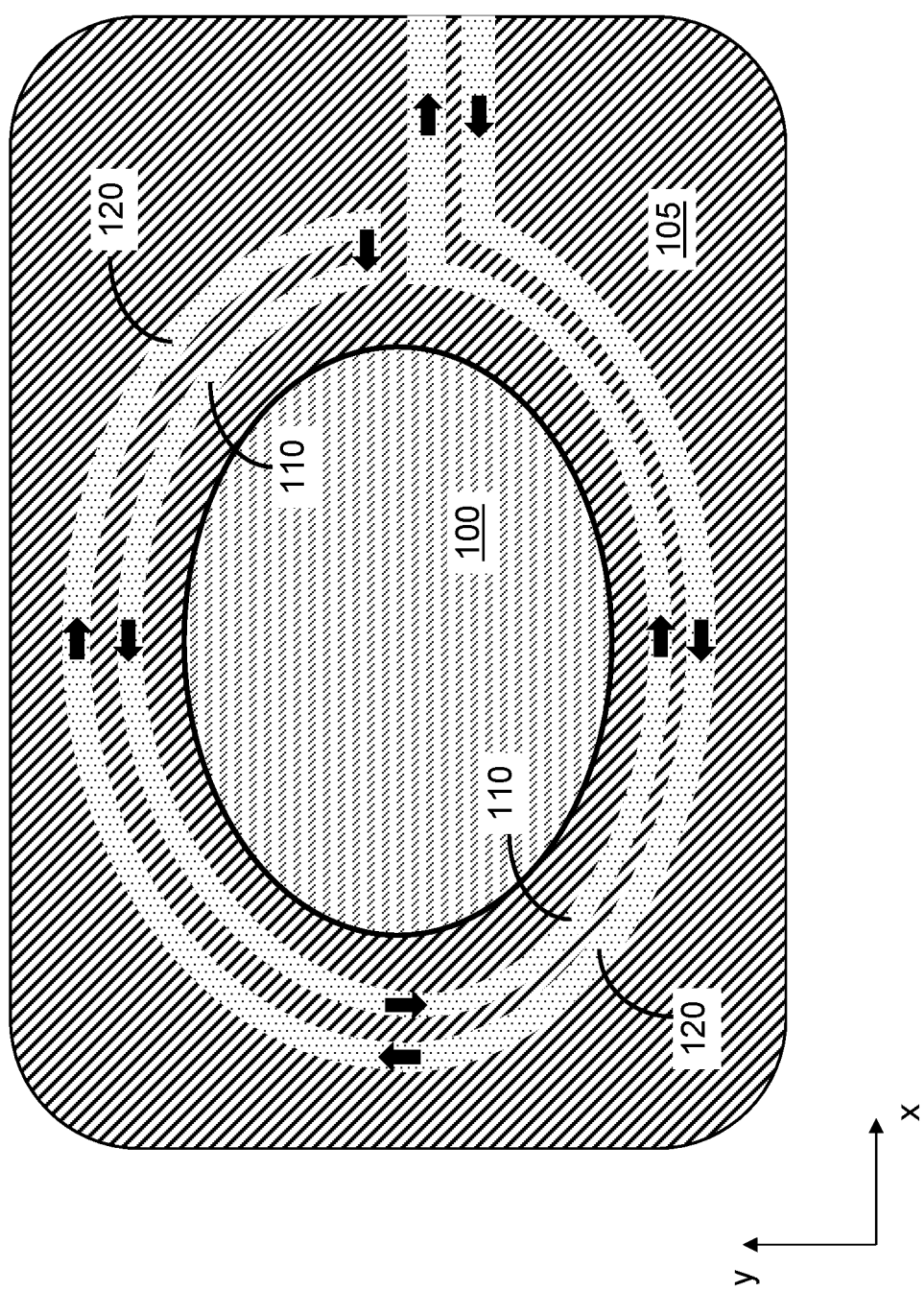
Figure 12A:
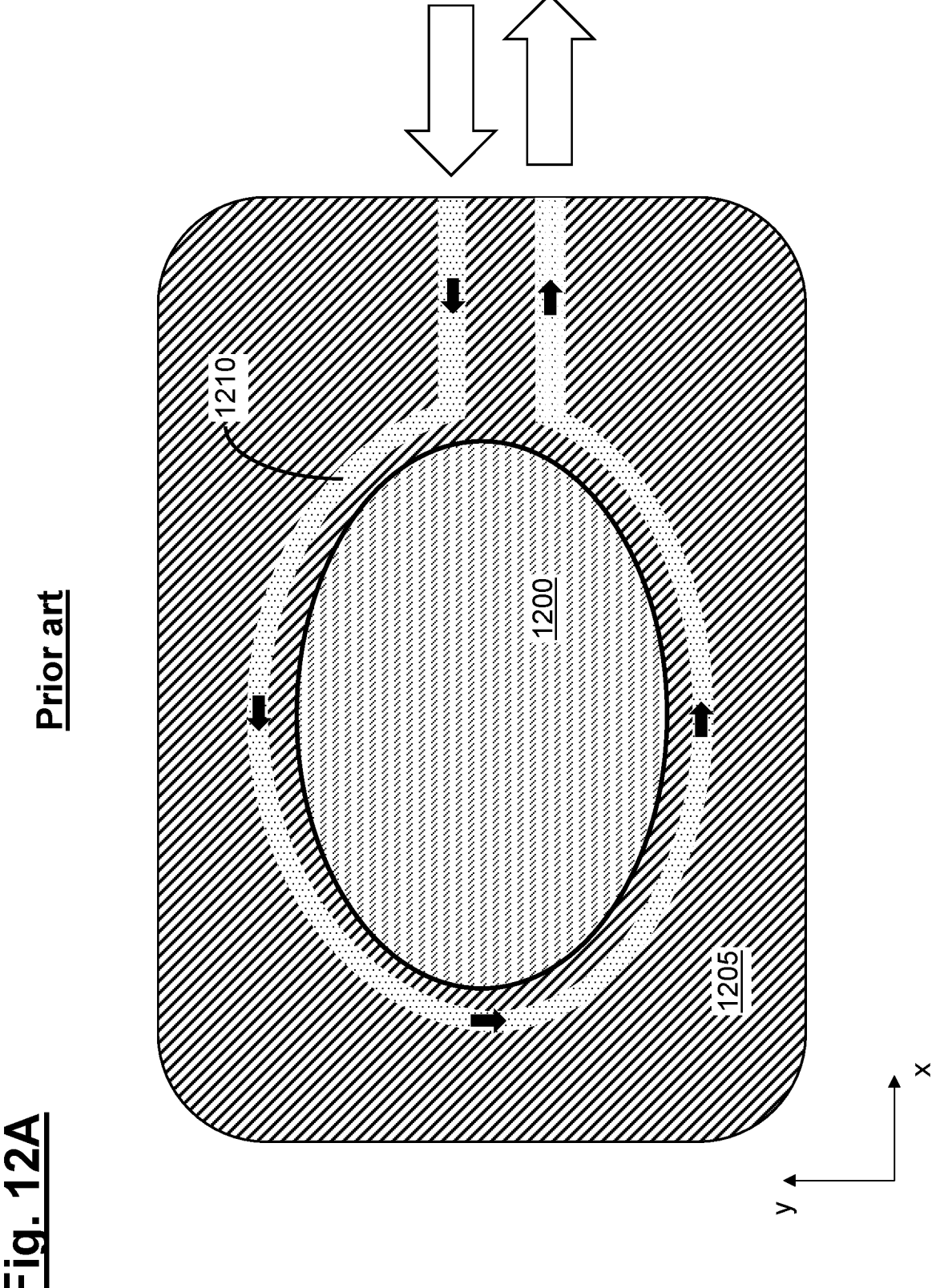
FIG. 12A-12D show schematic representations for explaining a problem arising during operation of a conventional assembly of an optical system.

FIG. 1A shows a schematic plan view of an assembly with an optical element 100 in the form of a (for example EUV) mirror, with "105" denoting a holder or outer enclosure of the optical element 100. The assembly according to FIG. 1A has—in this respect analogously to the conventional construction described with reference to FIG. 12A—a first channel system 110, through which a cooling fluid flows to absorb heat generated by electromagnetic radiation incident on the optical element 100.

In addition to this first channel system 110, the assembly according to FIG. 1A has a second channel system 120, which is arranged in relation to a center of the optical element 100 outside the first channel system 110 in the radial direction and in the exemplary embodiment concentrically therewith (but without the disclosure being restricted thereto) and shields the outer area of the assembly (i.e. the corresponding outer area of the holder 105) on the side of the first channel system 110 facing away from the optical element 100 from the heat absorbed by the cooling fluid in the first channel system 110.

According to FIG. 1A, the first and the second channel system 110, 120 are configured, merely by way of example, in such a way that the cooling fluid (entering from the right in FIG. 1A) first flows through the outer second channel system 120 and is thereby guided clockwise around the optical element 100, whereupon the cooling fluid passes into the first channel system 110 and flows through it, being guided counterclockwise around the optical element 100, until it finally exits (again on the right in FIG. 1A). The cooling fluid thereby heats up continuously. However, while this heating when the fluid flows around the optical element 100 in the first channel system 110 is analogous to FIG. 12A, only comparatively minor heating takes place in the outer second channel system 120 because, with a suitable design of the system with regard to the thermal resistance between the channel systems 110 and 120, the cooling fluid used and the amount of cooling fluid used, the heat flow which occurs between the first channel system 110 and the second channel system 120 is low in comparison to the heat flow which occurs from the optical element 100 to the first channel system 110.

Figure 1B:
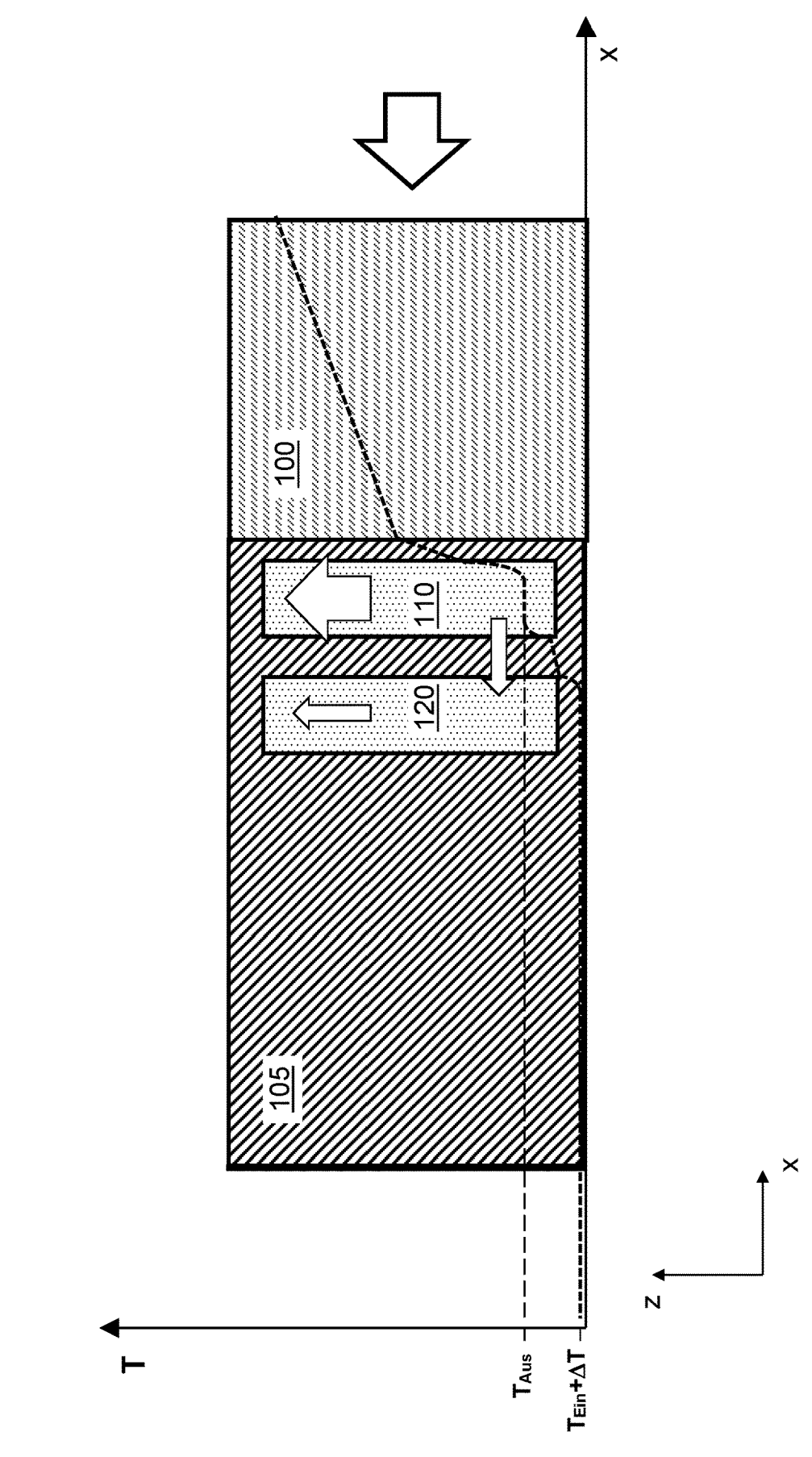

In FIG. 1B, the radial direction extending from the center of the optical element 100 is parallel to the x-axis. FIG. 1B shows that, along this radial direction, the first channel system 110 is not above the optical element 100, and the first channel system 110 is not below the optical element. FIG. 1B shows that, along this radial direction, the second channel system 120 is not above the optical element 100, and the second channel system 120 is not below the optical element.

Figure 12B:
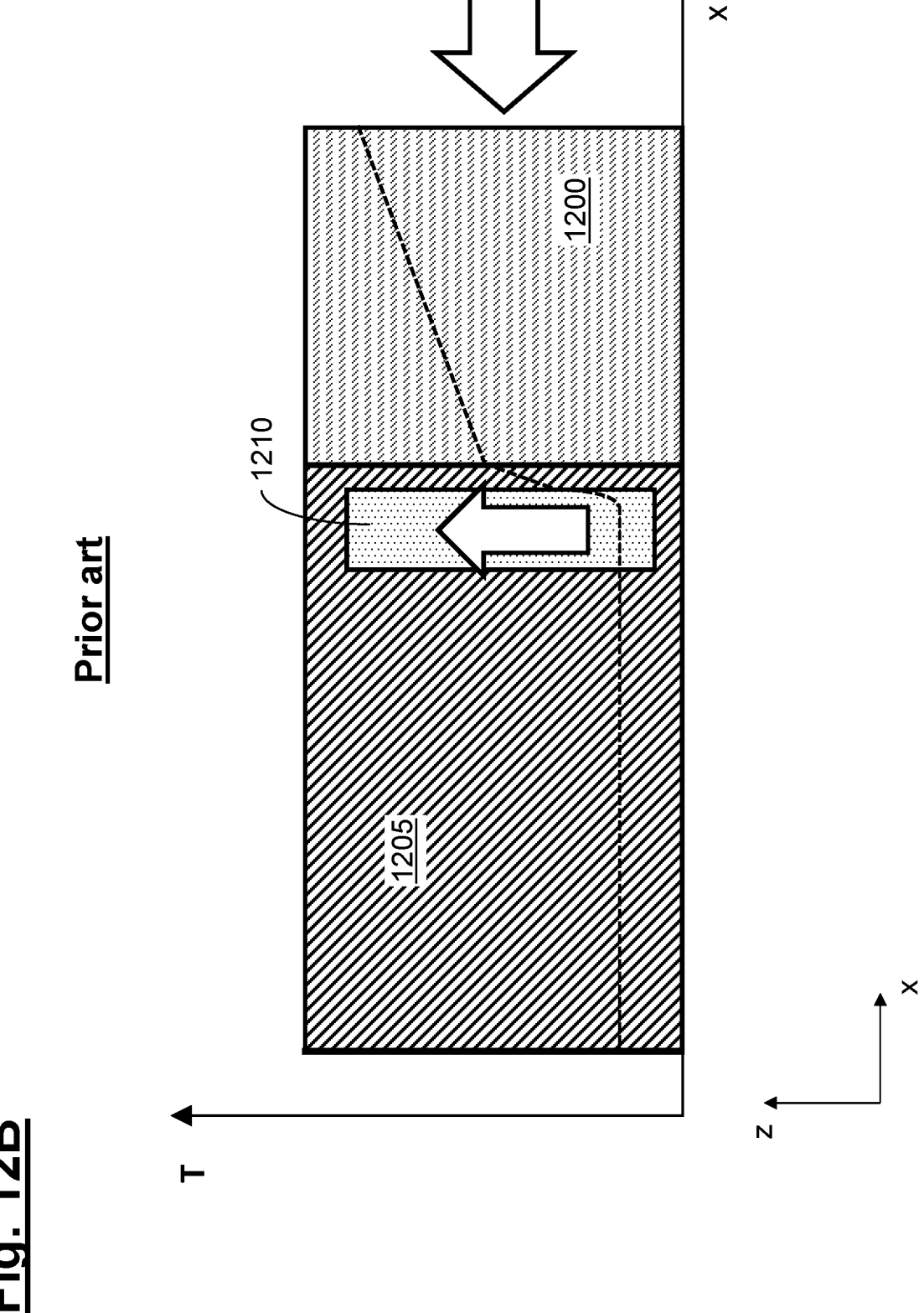
Figures 12C, 12D:
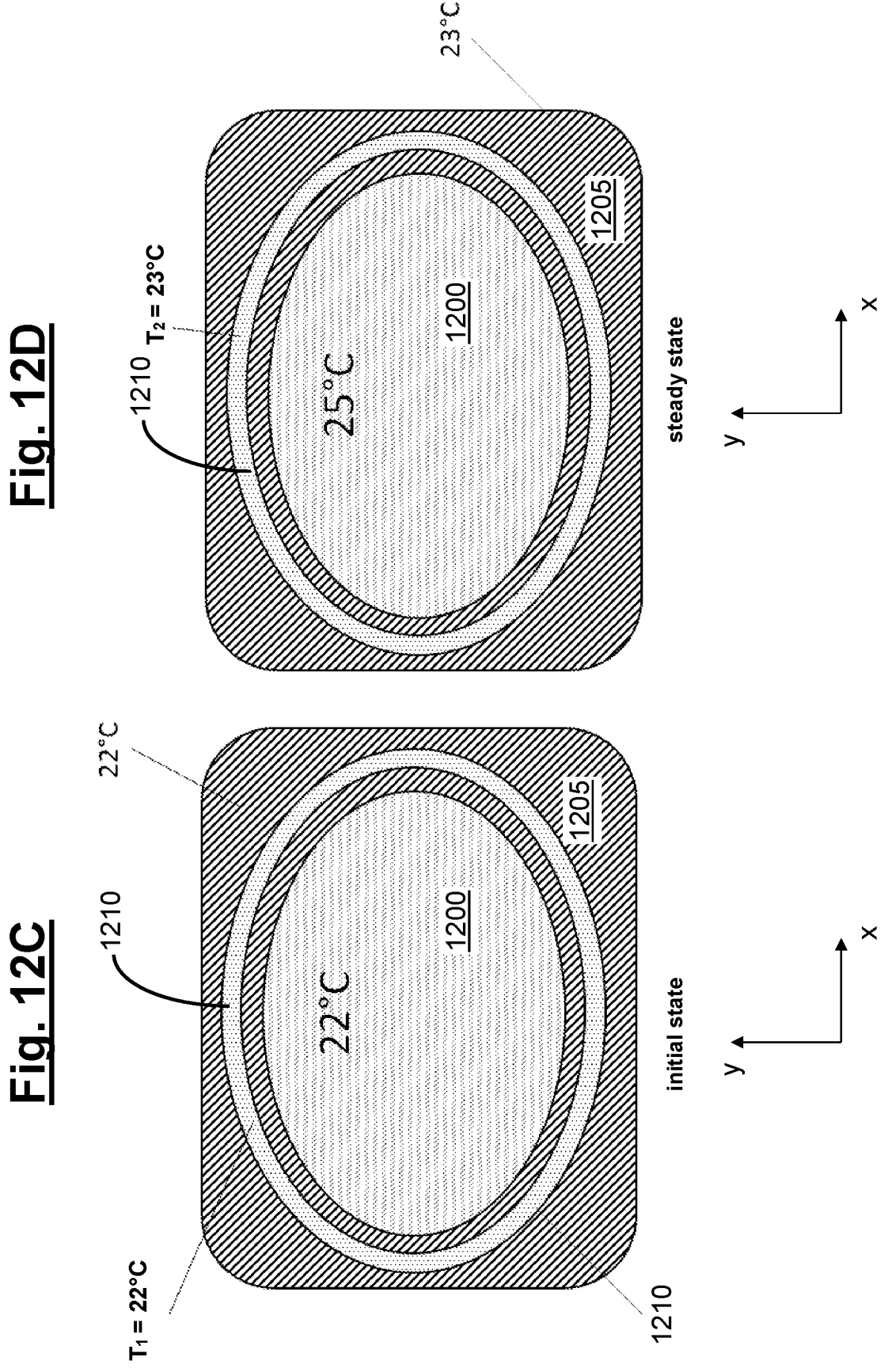

The aforementioned thermal shielding effect of the second channel system 120 has the result that—in contrast to the scenario described with reference to FIG. 12B during operation of a conventional assembly—the outer area of the holder 105 does not follow the temperature of the cooling fluid flowing in the first channel system 110, but rather can be kept below this cooling fluid temperature (which has increased due to radiation). This effect is indicated in FIG. 1B, where the temperature of the cooling fluid (which has increased due to radiation) (cooling fluid outlet temperature) within the first channel system 110 is denoted by $T_{Aus}$ and the final temperature in the second channel system 120 is denoted by $T_{Ein}+\Delta T$, and where, due to the shielding according to the disclosure in the outer area of the holder 105, the final temperature $T_{Ein}+\Delta T$ in the second channel system 120 can approximately match the cooling fluid inlet temperature $T_{Ein}$.

For the system shown in FIG. 1A, a heat balance-based derivation is given below, just by way of example, for a rough determination of the temperature increase $\Delta T$ in the second channel system 120, with the following designations being used with reference to FIG. 1C, FIG. 1D and Table 1:

TABLE 1

| $T_I$ | mean temperature in the first channel system |
|---|---|
| $T_{II}$ | mean temperature in the second channel system |
| $T_{Ein}$ | cooling fluid inlet temperature of the second channel system |
| $T_{Aus}$ | cooling fluid outlet temperature of the first channel system |
| $\Delta T$ | temperature increase in the second channel system |
| $T_{Ein} + \Delta T$ | cooling fluid outlet temperature of the second channel system |
| $c_p$ | specific heat capacity of the cooling fluid at constant pressure |
| $\dot{m}$ | cooling fluid mass flow |
| $R_{I-II}$ | total thermal resistance of the resistance chain between the cooling fluid of the first channel system and the cooling fluid of the second channel system |
| $\dot{Q}_{OE}$ | heat flow from the optical element to the first channel system |
| $\dot{Q}_{I-II}$ | heat flow from the first channel system to the second channel system |

Figure 1D:
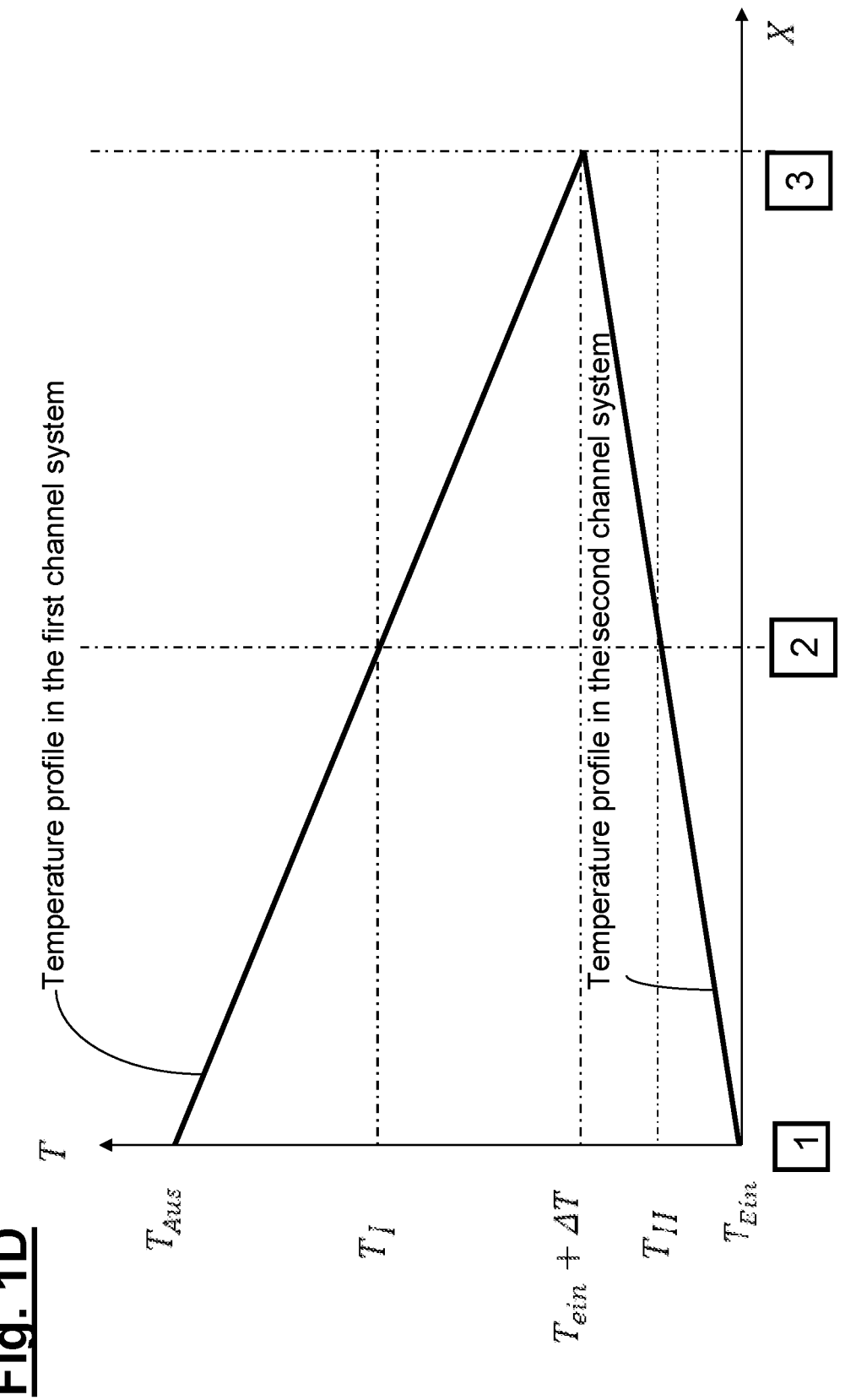

The representations of FIG. 1C and FIG. 1D are to be understood here as follows: FIG. 1C shows the cooling geometry from FIG. 1A, with a circumferentially curved x-coordinate being additionally shown, as well as temperature designations according to Table 1. FIG. 1D shows the temperature profiles in the two channel systems along the curved x-axis from FIG. 1C, and for example at points [1], [2] and [3], which are explicitly marked in FIG. 1C.

The following basic equations can apply:

$$\dot{Q}_{I-II} = \frac{T_I - T_{II}}{R_{I-II}} \tag{1}$$

$$\dot{Q}_{I-II} = \dot{m} \cdot c_p \cdot \Delta T \tag{2}$$

$$T_I = \frac{T_{Aus} + (T_{Ein} + \Delta T)}{2} \tag{3}$$

$$T_{II} = \frac{T_{Ein} + (T_{Ein} + \Delta T)}{2} = T_{Ein} + \frac{\Delta T}{2} \tag{4}$$

$$T_{Aus} = T_{Ein} + \frac{\dot{Q}_{OE}}{\dot{m} \cdot c_p} \tag{5}$$

This is based on the simplifying assumptions that the holder 105 is adiabatic insofar as there is no longer any heat exchange from the holder 1205 to the outside, and that the temperature increase due to the heat input in the two channel systems is linear in the direction of flow of the cooling fluid, as shown in FIG. 1D.

Equating (1) and (2) initially gives:

$$\frac{T_{II} - T_I}{R_{I-II}} = \dot{m} \cdot c_p \cdot \Delta T \tag{6}$$

After inserting equations (3) and (4), simple mathematical transformations result in equation (7):

$$\frac{T_{Aus} - T_{Ein}}{2 \cdot R_{I-II}} = \dot{m} \cdot c_p \cdot \Delta T \tag{7}$$

Inserting equation (5) leads to:

$$\frac{\dot{Q}_{OE}}{2 \cdot \dot{m} \cdot c_p \cdot R_{I-II}} = \dot{m} \cdot c_p \cdot \Delta T \tag{8}$$

and thus $$\Delta T = \frac{\dot{Q}_{OE}}{2 \cdot \dot{m}^2 \cdot c_p^2 \cdot R_{I-II}} \tag{9}$$

The total resistance $R_{I-II}$ can be calculated in a manner known to a person skilled in the art as a function of the heat transfer coefficients on the walls of the first and second channel systems 110, 120 and the thermal resistance between the channel systems 110, 120, which in turn is a function of the thermal conductivities of the materials used, the distance between the channel systems 110, 120 and the geometry between the channel systems 110,120.

Merely by way of example (and without the disclosure being restricted thereto), the dimensions of the web section between the first and second channel systems 110, 120 can be in the range from 2 mm to 50 mm. Likewise merely by way of example, given a diameter of the optical element or mirror 100 of 400 mm, the channel systems 110, 120 themselves can have a height of for example 50 mm, a width of 10 mm and a relative distance from one another of 20 mm.

Cooling fluid can flow through the first channel system 110 or the second channel system 120 in different ways, as is described below on the basis of different embodiments with reference to FIG. 2-11B.

FIG. 2 and FIG. 3A-3C first show schematic representations for explaining an embodiment, with components that are analogous or substantially functionally the same as in FIG. 1A being denoted by reference numerals increased by "100". According to FIG. 2, both the first channel system 210 and the second channel system 220 branch in such a way that the coolant flows simultaneously through areas of the respective channel system 210 or 220 located on opposite sides of the optical element 200.

Figure 2:
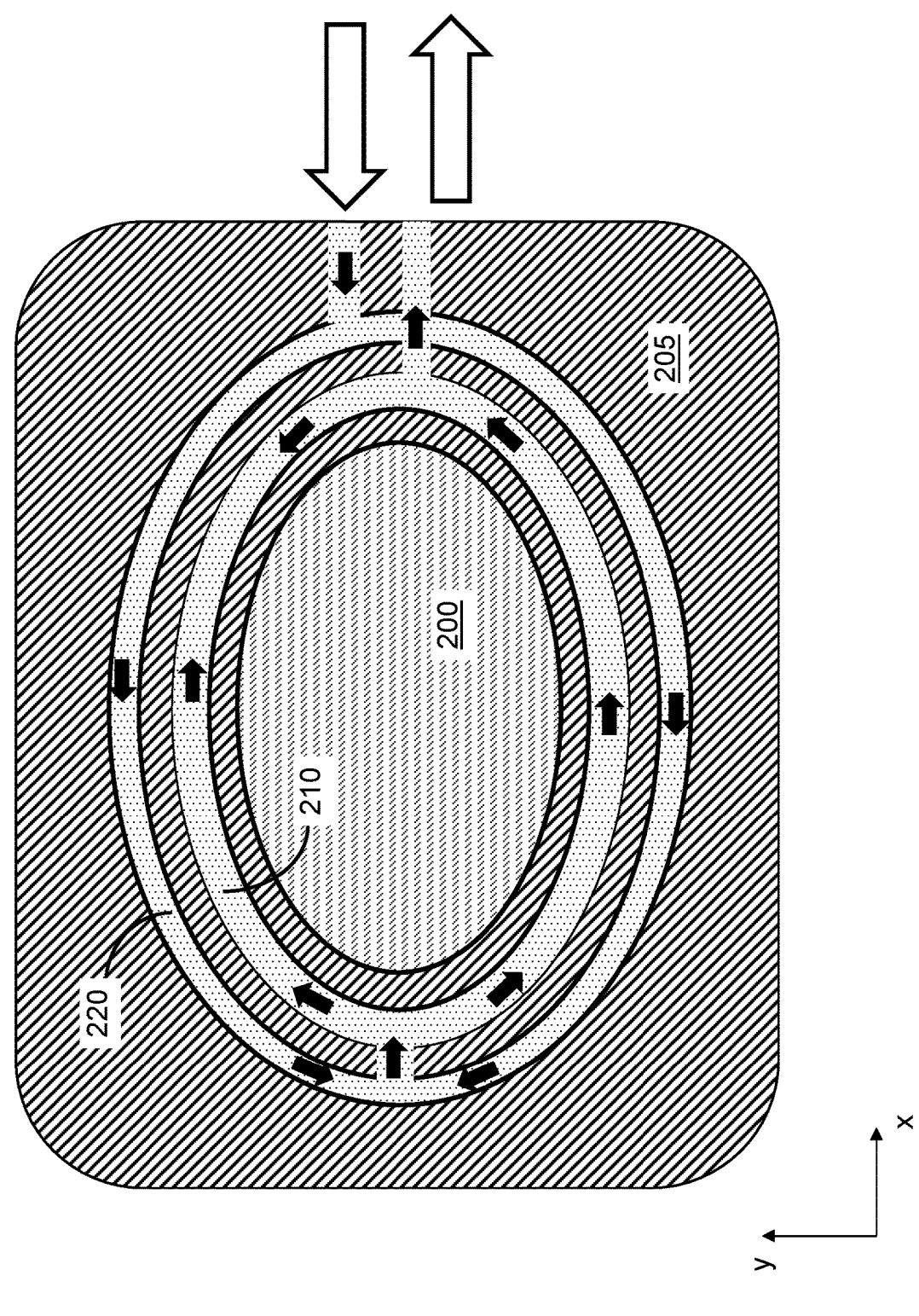
FIG. 2-6 show schematic representations for explaining the construction and functioning of further embodiments of an assembly according to the disclosure.
Figures 3A, 3B, 3C:
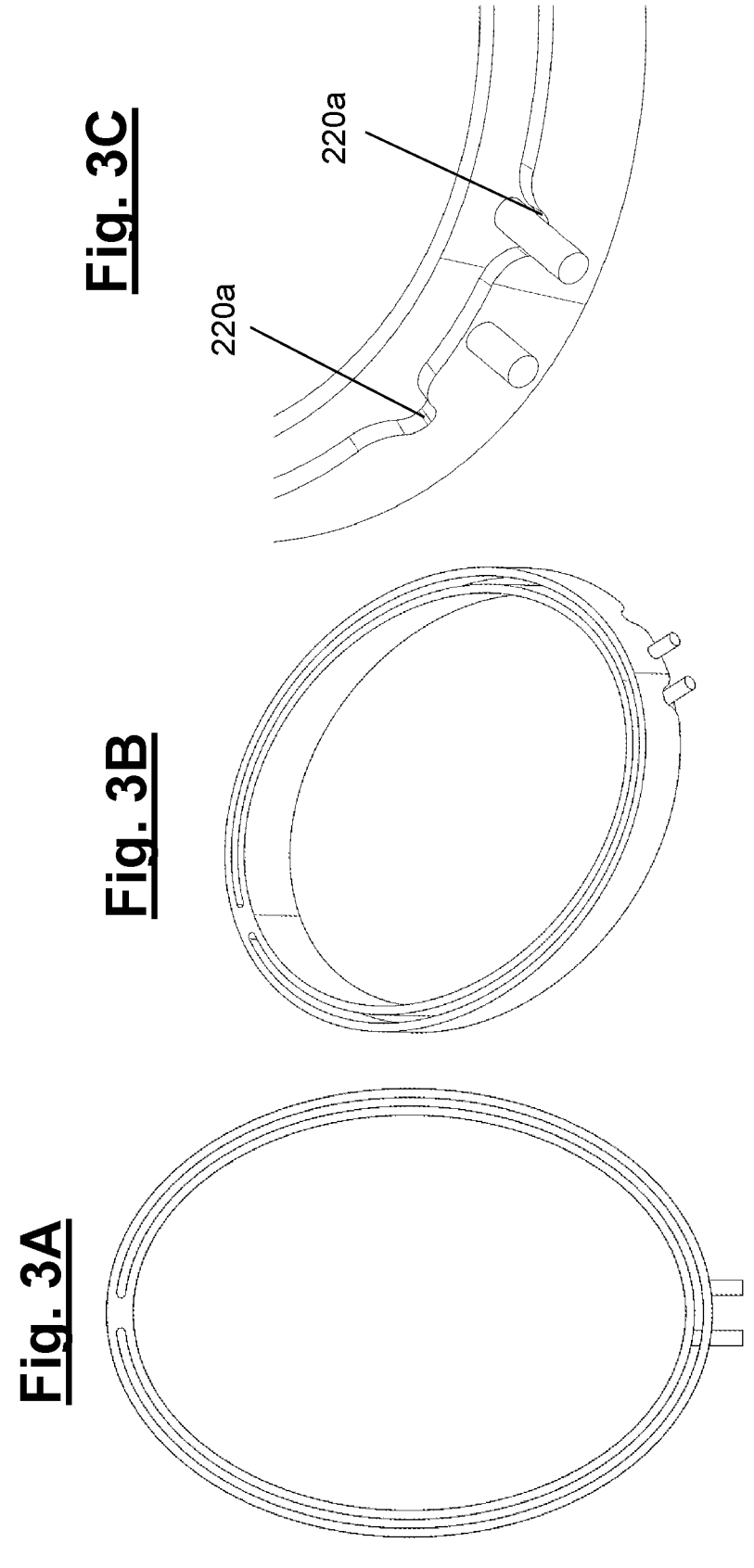

Specifically, coolant (according to FIG. 2 from the right) first enters the outer second channel system 220 and, according to the branch shown, flows simultaneously through areas of the second channel system 220 running opposite one another on both sides of the optical element 200, whereupon (as in FIG. 2 shown on the left) it passes into the first channel system 210 and in turn runs back on both sides to the optical element 200 until it emerges (as shown on the right in FIG. 2). FIG. 3A-3C show schematic representations of the respective channel geometry. According to FIG. 3C, the (outer) second channel system 220 has clearances 220*a* to enable the cooling fluid to drain from the (inner) first channel system 210 and clearances 220*b* to evenly distribute the cooling fluid to the upper side of the channel system 220 in FIG. 2 and the lower side of the channel system 220 in FIG. 2.

Effectively, in the embodiment of FIG. 2, both the outer second channel system 220 and the inner first channel system 210 are continuously circumferential (so that to this extent interruptions for the inlet and outlet of the cooling fluid are avoided). Furthermore, it can be achieved in the embodiment of FIG. 2 that the opposite sides in the y-direction (i.e. the upper side of the optical element 200 in FIG. 2 and the lower side of the optical element 200 in FIG. 2) are cooled equally well by way of the inner first channel system 210.

The embodiments described previously with reference to FIGS. 1A and 2 (as well as also subsequently in FIGS. 5 and 6) have in common that altogether only one cooling fluid supply and one cooling fluid discharge are used. The disclosure makes use of the fact that the desired effect can nevertheless be achieved with suitable thermal insulation between the first and second channel systems (as will be described in more detail below with reference to FIG. 6).

Figure 4:
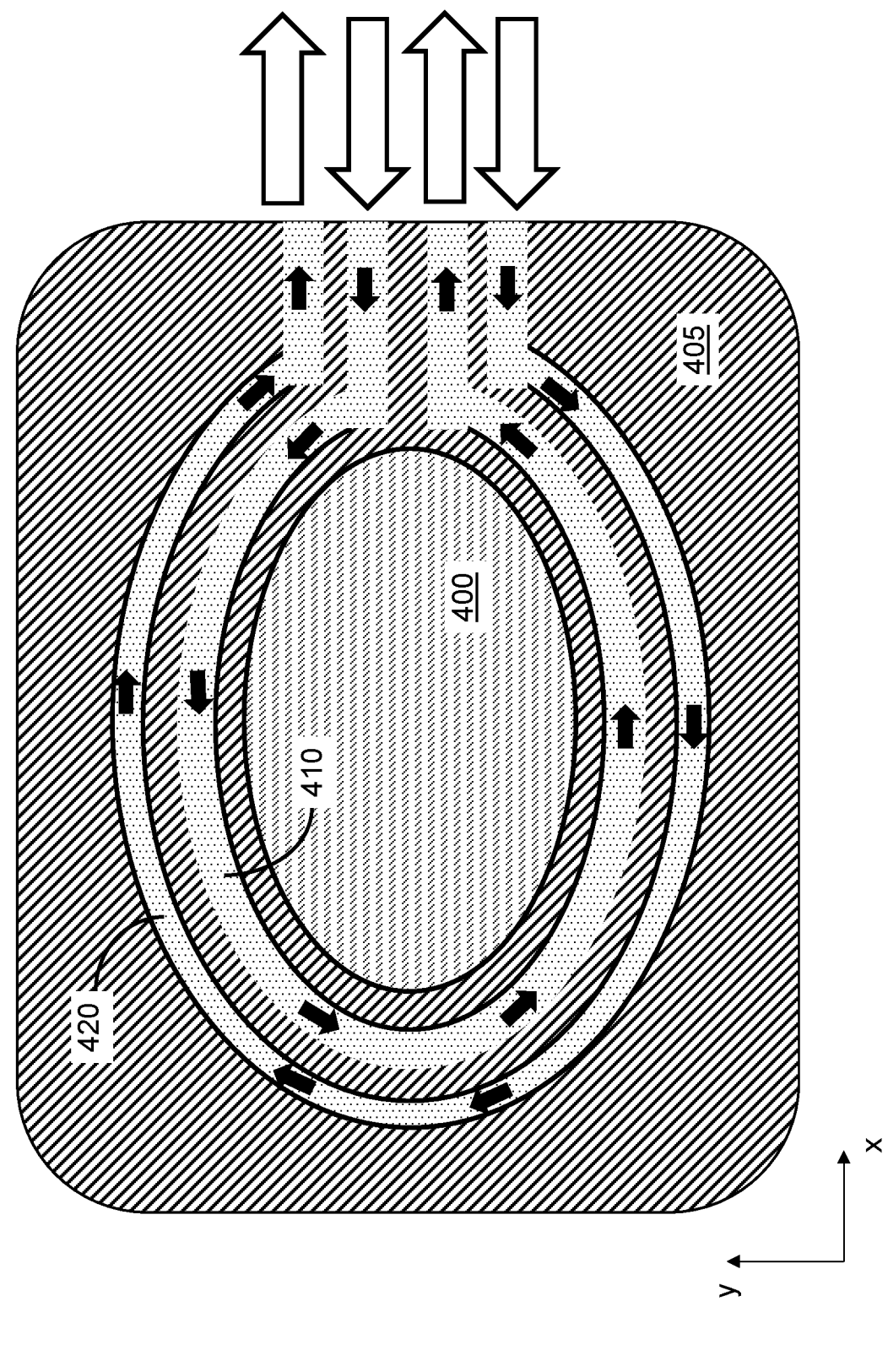

FIG. 4 shows a further embodiment in a schematic representation, components that are analogous or substantially functionally the same as in FIG. 2 in turn being denoted by reference numerals increased by "200". According to FIG. 4, in contrast to the previously described embodiments, the channel systems 410, 420 are not in fluid communication, so that cooling fluid can flow through both channel systems 410, 420 independently of one another. As a result, different temperatures of the respective cooling fluid can also be set for the two channel systems 410, 420 from the outset, with the result that the desired properties for the thermal insulation between the two channel systems 410, 420 are also reduced. The flow through the channel systems 410, 420 takes place in opposite directions according to FIG. 4, with the cooling fluid in the outer second channel system 420 flowing around the optical element 400 in a clockwise direction, merely by way of example, whereas the cooling fluid in the first channel system 410 flows around the optical element 400 in a counterclockwise direction.

Figure 5:
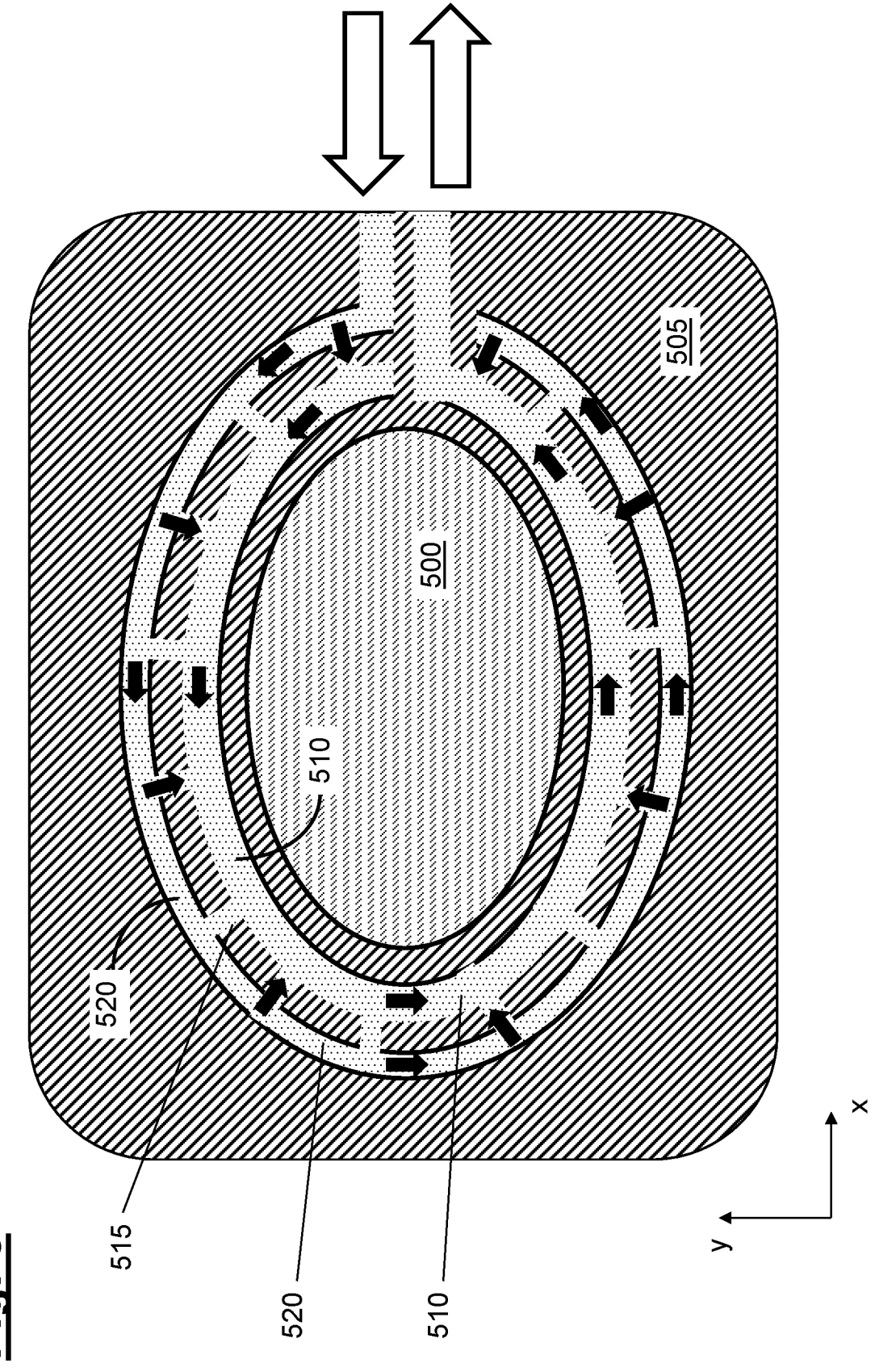

FIG. 5 shows a further embodiment in a schematic representation, components that are analogous or substantially functionally the same as in FIG. 4 in turn being denoted by reference numerals increased by "100". The embodiment of FIG. 5 differs from that of FIG. 1-4 in that the outer second channel system 520 is in fluid communication with the inner first channel system 510 via nozzles 515, these nozzles 515 being arranged along the circumferential direction in relation to the optical element 500. The nozzles 515 can be used to effectively achieve impingement cooling from the second channel system 520, which is comparatively colder and outer in relation to the optical element 500, to the first channel system 510, which is comparatively warmer and inner in relation to the optical element 500, resulting in relatively good heat transfer between the cooling fluid in the inner first channel system 510 and the channel wall in relation to the optical element 500 being achieved. Conversely, in addition to increased manufacturing effort, it is accepted that there may be turbulences in the cooling fluid, which in turn can cause vibrations.

Figure 6:
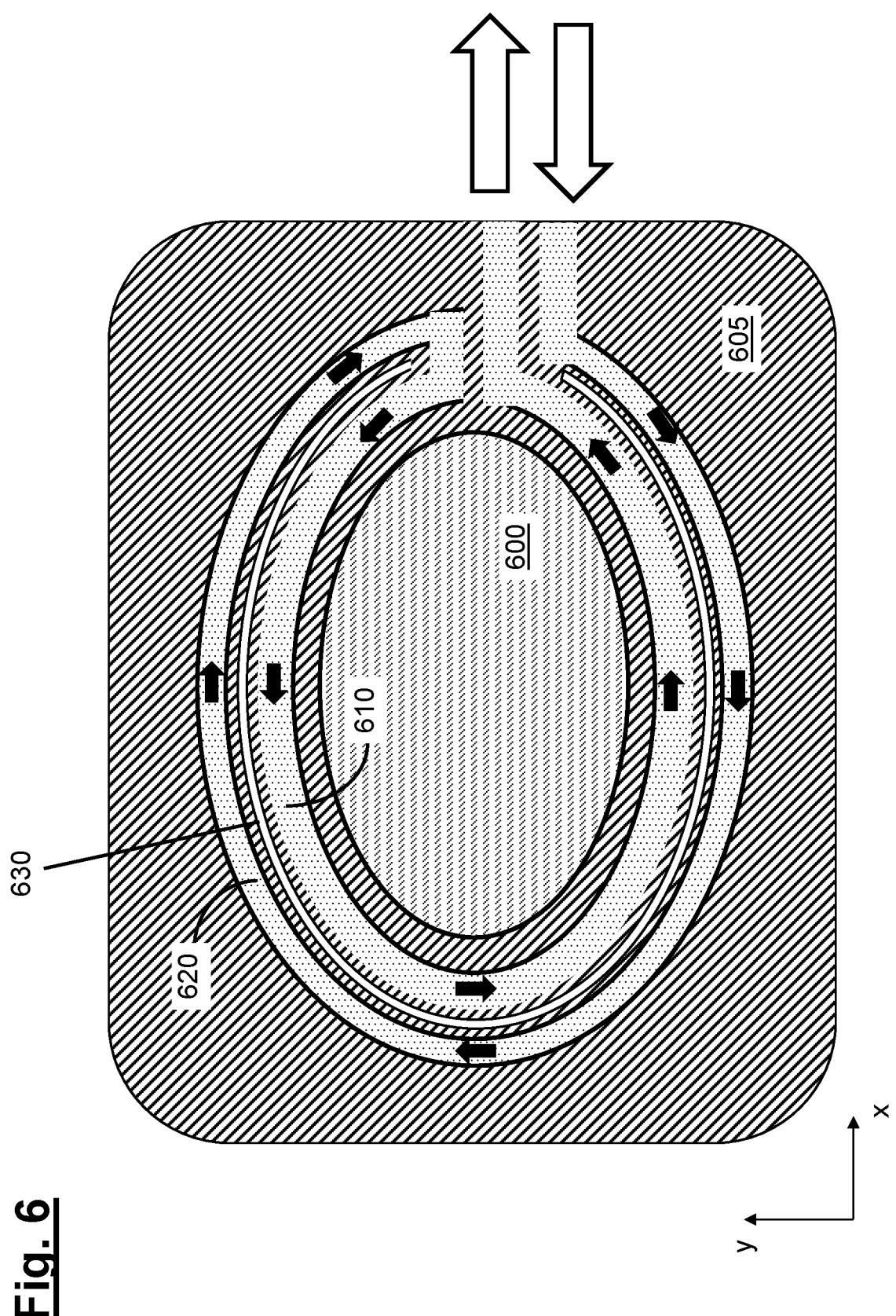
Figure 7:
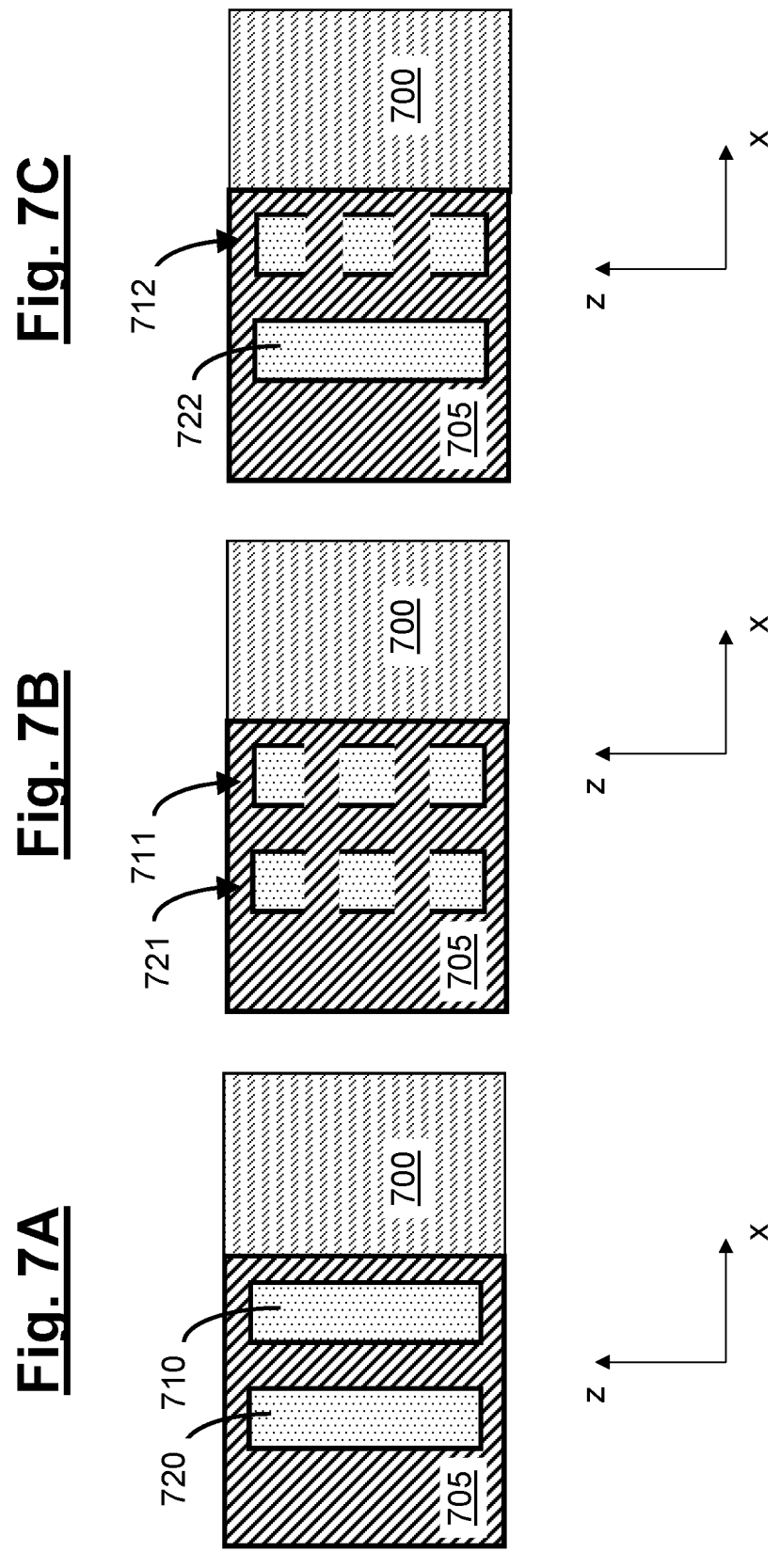
FIG. 7A-7C show schematic detailed schematic representations for explaining different embodiments of a first or second channel system present in an assembly according to the disclosure.

FIG. 6 shows a further embodiment in a schematic representation, components that are analogous or substantially functionally the same as in FIG. 5 in turn being denoted by reference numerals increased by "100". The embodiment of FIG. 6 is similar to that of FIG. 1A with regard to the flow through the first and second channel systems 610, 620, although according to FIG. 6 an area of increased thermal insulation in the form of a gap 630 is additionally arranged between the first channel system 610 and the second channel system 620. The additional thermal resistance between the first and second channel systems 610, 620 that is provided by this area can at least largely ensure thermal decoupling of the first and second channel systems 610, 620 even if the temperature of the cooling fluid in the first channel system 610 increases significantly, and heating of the cooling fluid in the outer second channel system 620 can be reduced or prevented. Ideally, the heat flow from the inner first channel system to the outer second channel system can be reduced to almost zero, with the result that the temperature gradient between the first channel system 610 and the second channel system 620 is at a maximum and the temperature of the cooling fluid in the second channel system 620 corresponds exactly to the cooling fluid inlet temperature.

As described below with reference to the schematic representations of FIG. 7A to FIG. 10C, the first channel system and/or the second channel system can also be formed as a channel array made up of a plurality of channels.

The sectional views of FIG. 7A-7C serve for illustration. For comparison, FIG. 7A shows the configuration both of the inner first channel system 710 and of the outer second channel system 720 each with only one channel, analogously to the embodiments described above with reference to FIG. 1-6, while according to FIG. 7B the inner first channel system 711 and the outer second channel system 721 are each constructed as an array of three channels. FIG. 7C shows a configuration of the inner first channel system 712 as an array of three channels, whereas the outer second channel system 722 is constructed analogously to FIG. 7A with only one channel. FIGS. 7A-7C show an optical element 700 and a holder 705.

In FIGS. 7A-7C, the radial direction extending from the center of the optical element 700 is parallel to the x-axis. Figure FIGS. 7A-7C show that, along this radial direction, the first channel system 710 (711, 712) is not above the optical element 700, and the first channel system 710 (711, 712) is not below the optical element 100. FIG. 1B shows that, along this radial direction, the second channel system 720 (721, 722) is not above the optical element 700, and the second channel system 720 (721, 722) is not below the optical element 700.

Figure 8:
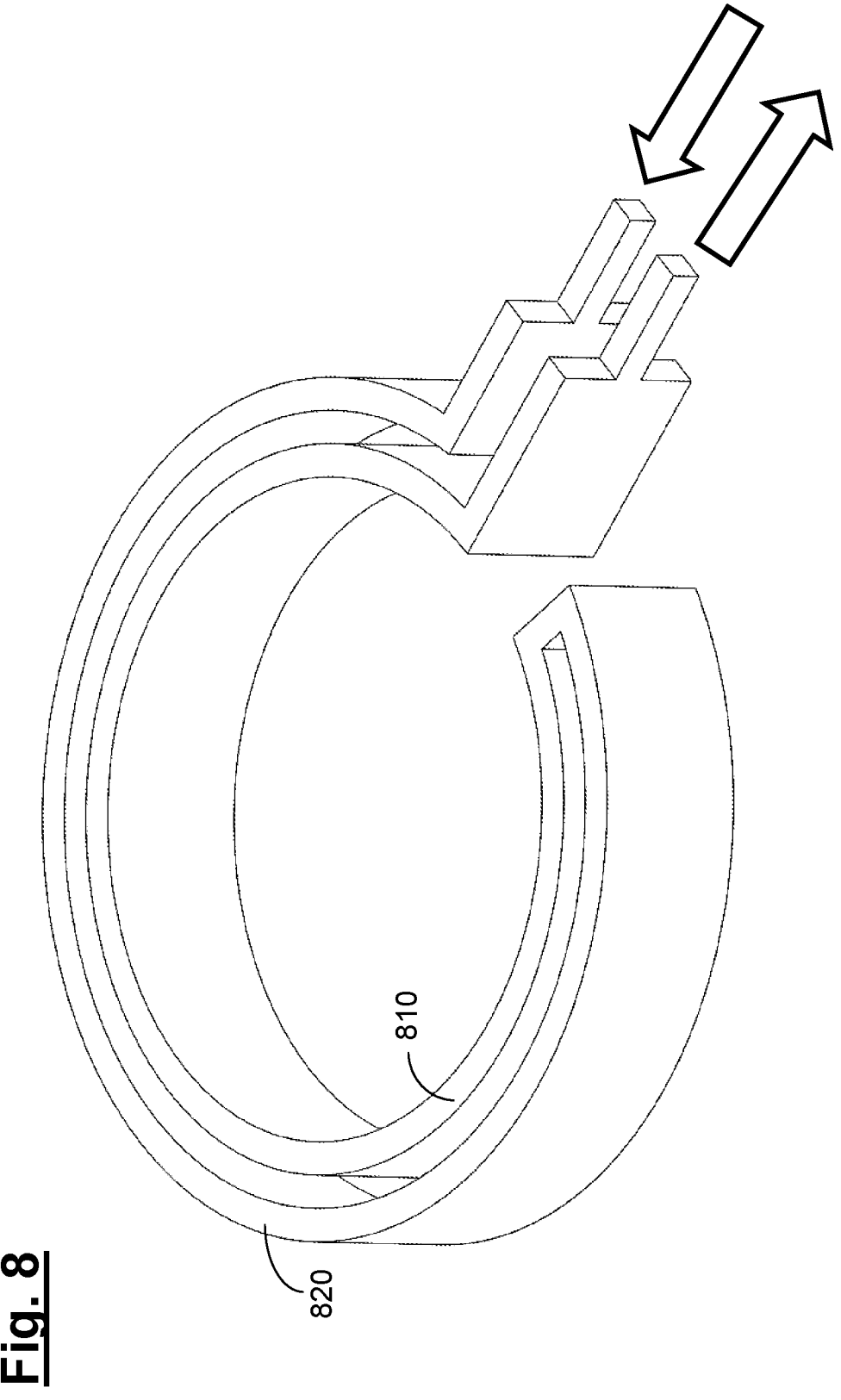
FIG. 8 shows a schematic perspective view for explaining the possible construction of an assembly on the basis of the embodiment of FIG. 7A.
Figures 9A, 9B, 9C:
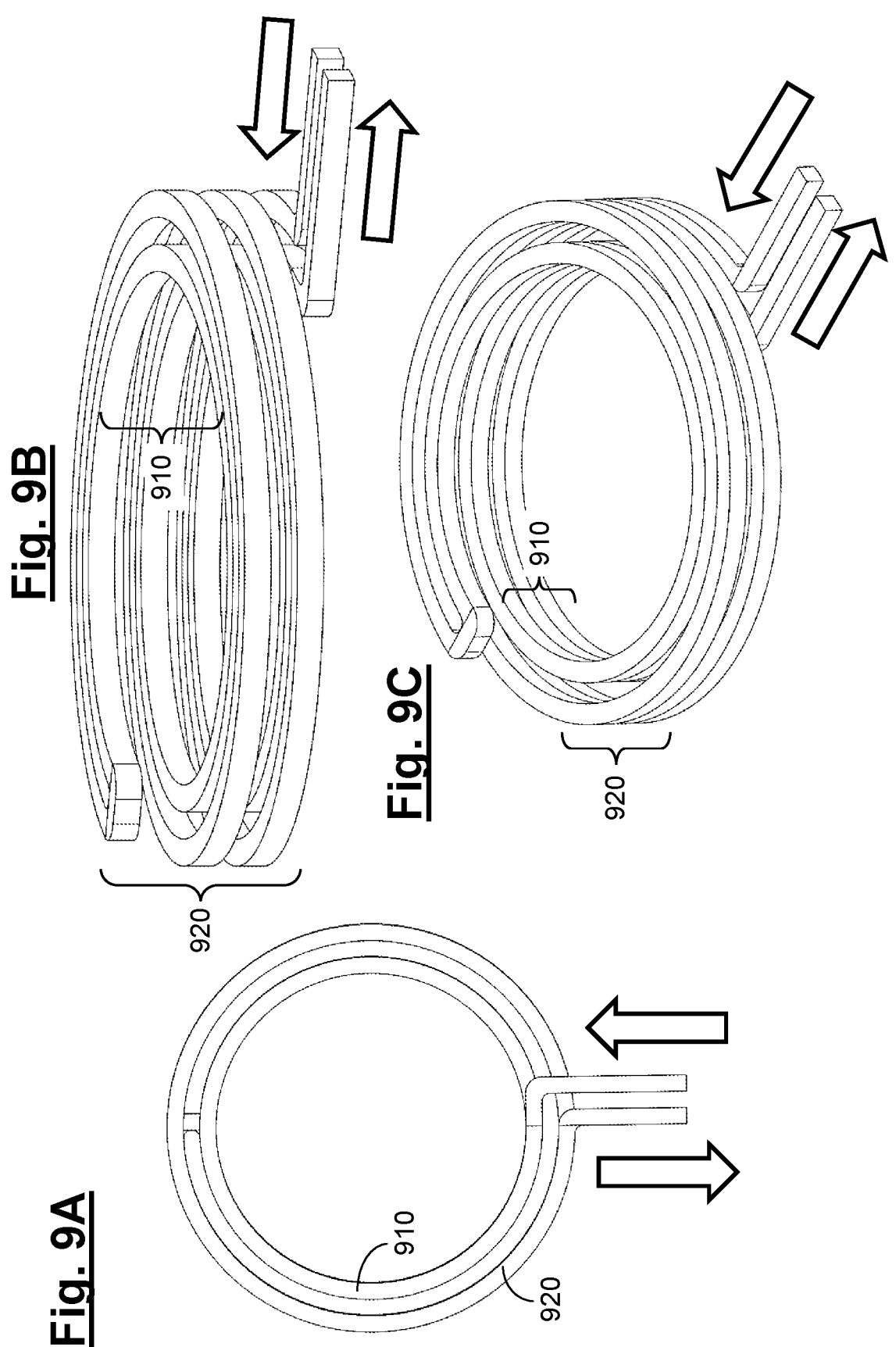
FIG. 9A-9C show schematic representations for explaining the possible construction of an assembly according to the embodiment of FIG. 7B.
Figures 10A, 10B, 10C:
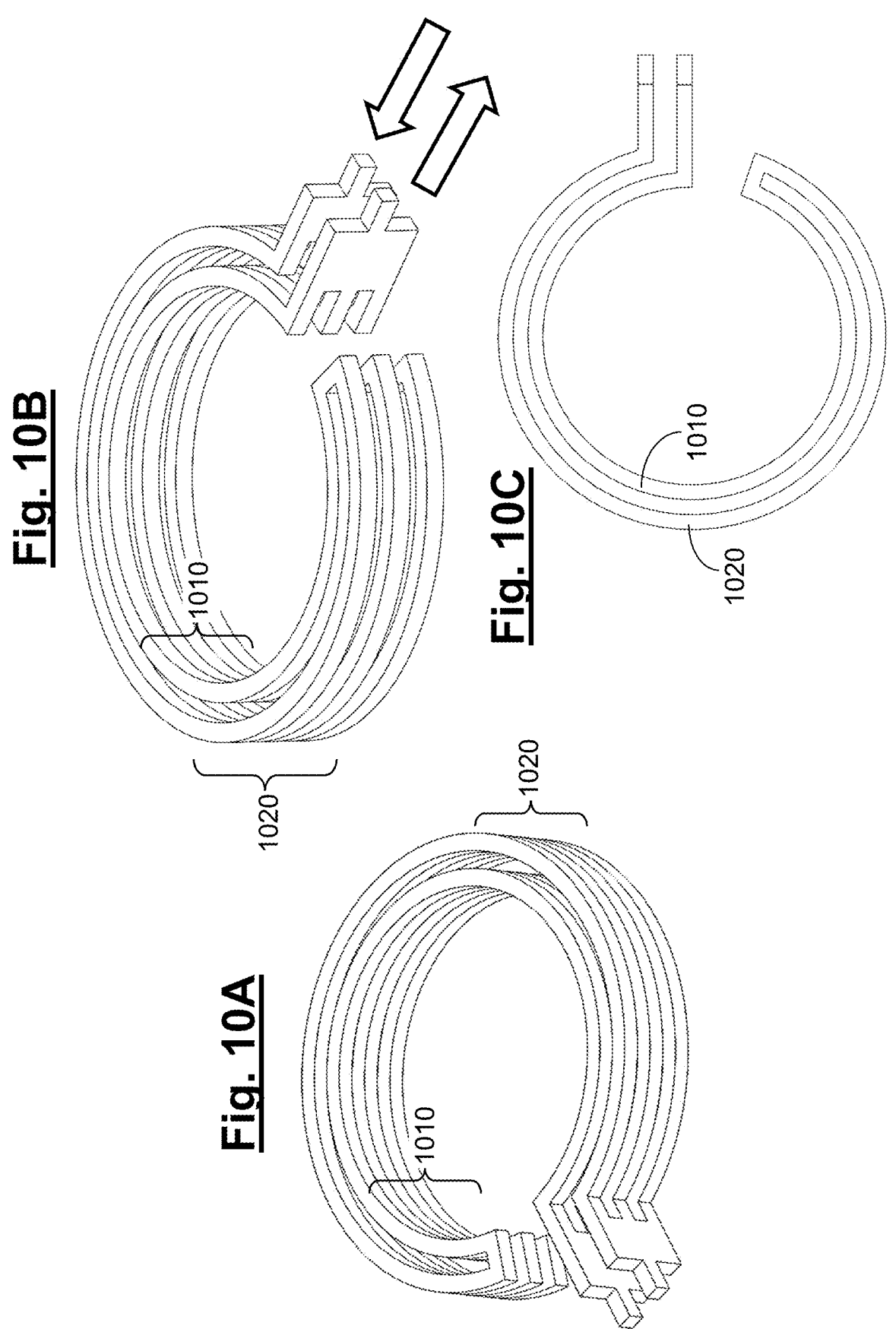
FIG. 10A-10C show schematic representations for explaining the construction of an assembly according to the embodiment of FIG. 7B.

The schematic representations of FIG. 8 to FIG. 10C show suitable channel geometries for implementing the embodiments of FIG. 7A-7C. The geometry according to FIG. 8 serves here for implementing the embodiment of FIG. 7A, and the channel geometries of FIGS. 9A-9C and 10A-10C respectively serve for implementing the embodiment of FIG. 7B. FIG. 8 shows an inner first channel system 810 and an outer second channel system 820. FIGS. 9A-9C show an inner first channel system 910 and an outer second channel system 920. FIGS. 10A-10C show an inner first channel system 1010 and an outer second channel system 1020.

Figure 11A:
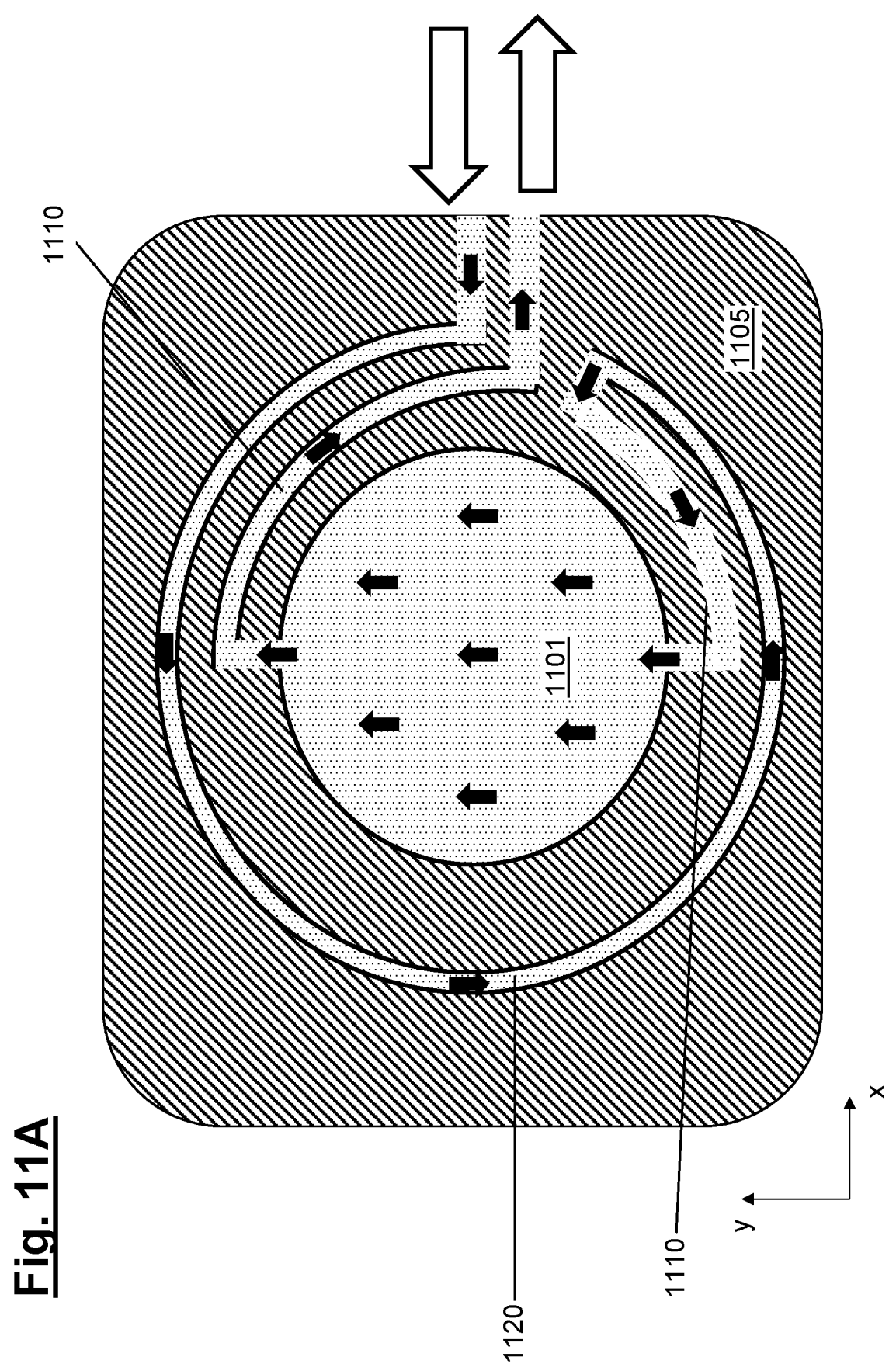
FIG. 11A-11B show schematic representations for explaining an implementation of the disclosure in connection with a volumetric cooling of an optical element.
Figure 11B:
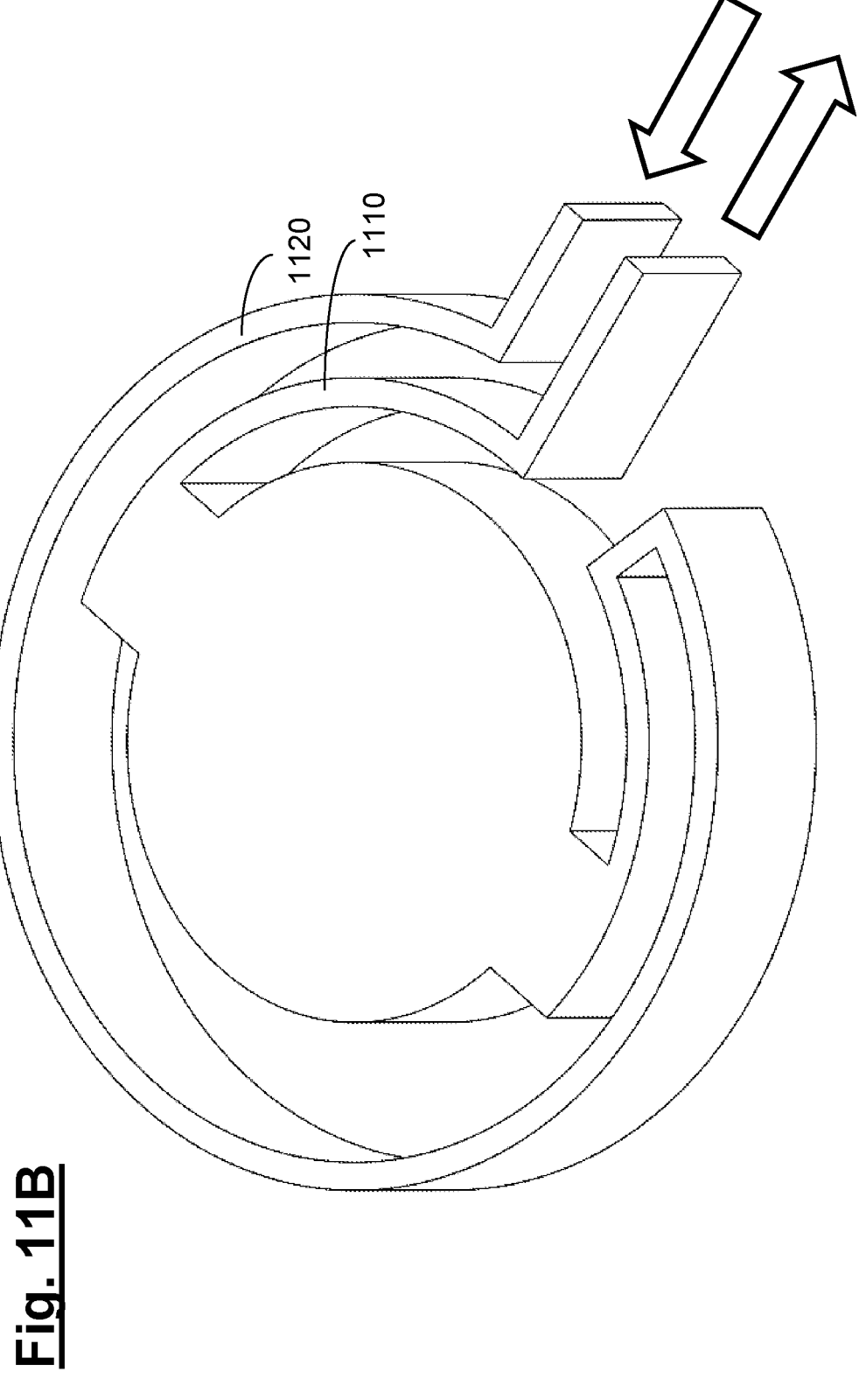

FIG. 11A-11B show a further embodiment in a schematic representation, components that are analogous or substantially functionally the same as in FIG. 6 being denoted by reference numerals increased by "500". According to FIG. 11A, the first channel system 1110 is connected to a volumetric cooler 1101 for cooling the optical element (not shown in FIG. 11A). With this volumetric cooling, in a manner known per se, cooling fluid can for example flow through the area remaining between adjacent components for the mechanical connection of mirror elements of a mirror module, in order to achieve relatively effective cooling of the mirror elements in question.

Even though the disclosure has been described on the basis of specific embodiments, numerous variations and alternative embodiments will be apparent to a person skilled in the art, for example by the combination and/or exchange of features of individual embodiments. Accordingly, it goes without saying for a person skilled in the art that such variations and alternative embodiments are also included by the present disclosure, and the scope of the disclosure is restricted only within the meaning of the accompanying patent claims and the equivalents thereof.

What is claimed is:

1. An assembly, comprising:

an optical element having a center;

a first channel system; and a second channel system, wherein:

the first channel system is within an outer enclosure for the optical element;

relative to the center of the optical element, the first channel system is entirely outside the optical element in a radial direction that extends from the center of the optical element;

relative to the center of the optical element, the second channel system is entirely outside the first channel system in the radial direction;

the first channel system is configured to have cooling fluid flow therethrough to dissipate heat absorbed by the optical element due to electromagnetic radiation incident on the optical element;

the second channel system is configured to have a cooling fluid flow therethrough to at least partially thermally shield an area of the assembly from the heat absorbed by the cooling fluid in the first channel system; and along a direction perpendicular to the radial direction:
i) the first channel system is not above the optical element; and
ii) the first channel system is not below the optical element.

2. The assembly of claim 1, wherein the first channel system is within a holder outside the optical element.

3. The assembly of claim 2, wherein the second channel system is within the holder.

4. The assembly of claim 2, wherein the holder holds the optical element.

5. The assembly of claim 1, wherein the area is on a side of the first channel system facing away from the optical element.

6. The assembly of claim 1, wherein, relative to the center of the optical element, the first and second channel systems are concentric.

7. The assembly of claim 1, wherein the area comprises a member configured to support the optical system.

8. The assembly of claim 1, wherein an area of increased thermal insulation is between the first and second channel systems.

9. The assembly of claim 8, wherein the area of increased thermal insulation comprises a gap.

10. The assembly of claim 1, further comprising a third channel system between the first and second channel systems.

11. The assembly of claim 1, wherein at least one member selected from the group consisting of the first channel system and the second channel system comprises an array of channels.

12. The assembly of claim 1, wherein the first and second channel systems are in fluid communication.

13. The assembly of claim 1, further comprising a plurality of nozzles configured to provide fluid communication between the first and second channel systems.

14. The assembly of claim 1, wherein the first and second channel systems are configured to have cooling fluid enter the first channel system after flowing through the second channel system.

15. The assembly of claim 1, wherein:

the first channel system is configured to have cooling fluid flow therethrough; and the second channel system is configured to have cooling fluid therethrough independently of cooling fluid flow through the first channel system.

16. The assembly of claim 1, wherein at least one member selected from the group consisting of the first channel system and the second channel system branches at least once into areas configured to have cooling fluid flow therethrough.

17. The assembly of claim 1, further comprising a volumetric cooler connected to the first channel system to cool the optical element.

18. The assembly of claim 1, wherein the optical element comprises a member selected from the group consisting of a mirror or a mirror array comprising a plurality of mirror elements.

19. An optical system, comprising an assembly according to claim 1, wherein the optical system is a microlithographic projection exposure apparatus.

20. The assembly of claim 1, wherein, along the direction perpendicular to the radial direction:
i) the second channel system is not above the optical element; and
ii) the second channel system is not below the optical element.

* * * * *